(12) United States Patent
Yacoby et al.

(10) Patent No.: US 11,747,740 B2
(45) Date of Patent: Sep. 5, 2023

(54) SELF-SUPERVISED REPRESENTATION LEARNING FOR INTERPRETATION OF OCD DATA

(71) Applicant: NOVA LTD, Rehovot (IL)

(72) Inventors: Ran Yacoby, Rehovot (IL); Boaz Sturlesi, Rehovot (IL)

(73) Assignee: NOVA LTD, Rehovot (IL)

( * ) Notice: Subject to any disclaimer, the term of this patent is extended or adjusted under 35 U.S.C. 154(b) by 0 days.

(21) Appl. No.: 17/790,765

(22) PCT Filed: Jan. 6, 2021

(86) PCT No.: PCT/IL2021/050018
§ 371 (c)(1),
(2) Date: Jul. 5, 2022

(87) PCT Pub. No.: WO2021/140508
PCT Pub. Date: Jul. 15, 2021

(65) Prior Publication Data
US 2023/0014976 A1   Jan. 19, 2023

Related U.S. Application Data

(60) Provisional application No. 62/957,339, filed on Jan. 6, 2020.

(51) Int. Cl.
*G01N 21/47* (2006.01)
*G03F 7/20* (2006.01)
(Continued)

(52) U.S. Cl.
CPC ...... *G03F 7/70625* (2013.01); *G03F 7/70508* (2013.01); *G06N 3/08* (2013.01)

(58) Field of Classification Search
CPC .......... G03F 7/70625; G03F 7/70508; G01N 2021/8883; G01N 21/4788;
(Continued)

(56) References Cited

U.S. PATENT DOCUMENTS 10,295,342 B2 *  5/2019  Pandev ............... G01B 21/042
2003/0188279 A1 * 10/2003  Doddi ................. G06Q 50/04
702/189
(Continued)

FOREIGN PATENT DOCUMENTS

EP    3579052 A1 * 12/2019  ......... G03F 7/70616
EP    3751342 A1 * 12/2020  ......... G01N 21/8851

OTHER PUBLICATIONS

Geer, "Correlated observation error models for assimilating all-sky infrared radiances", Atmos. Meas. Tech., Jul. 4, 2019, pp. 3629-3657, vol. 12, Copernicus Publications, Göttingen, DE.

*Primary Examiner* — Jeffrey P Aiello
(74) *Attorney, Agent, or Firm* — ALPHAPATENT ASSOCIATES, LTD; Daniel J. Swirsky

(57) ABSTRACT

A system and methods for OCD metrology are provided including receiving multiple first sets of scatterometric data, dividing each set into k sub-vectors, and training, in a self-supervised manner, k2 auto-encoder neural networks that map each of the k sub-vectors to each other. Subsequently multiple respective sets of reference parameters and multiple corresponding second sets of scatterometric data are received and a transfer neural network (NN) is trained. Initial layers include a parallel arrangement of the k2 encoder neural networks. Target output of the transfer NN training is set to the multiple sets of reference parameters and feature input is set to the multiple corresponding second sets of scatterometric data, such that the transfer NN is trained to estimate new wafer pattern parameters from subsequently measured sets of scatterometric data.

14 Claims, 5 Drawing Sheets

(51) Int. Cl.
*G06N 3/08* (2023.01)
*G01B 11/02* (2006.01)
*G01N 21/956* (2006.01)
*G06T 1/40* (2006.01)
*G03F 7/00* (2006.01)

(58) Field of Classification Search
CPC ............ G01N 21/9501; G01N 21/956; G01N 2201/1296; G01B 11/02; G01B 11/0625; G06N 3/08
USPC ........ 257/21.53; 356/237.1–237.5, 369, 399, 356/445, 601, 625; 438/5–7, 14–16; 700/28, 48–50, 95–96, 108–110, 700/120–121; 702/1, 27, 33, 40, 81–85, 702/108, 117, 127, 150, 155, 159, 167, 702/172, 179, 182, 189; 703/2
See application file for complete search history.

(56) References Cited

U.S. PATENT DOCUMENTS

| | | | | |
|---|---|---|---|---|
| 2014/0079312 A9* | 3/2014 | Brill | ........................ | G01B 11/02 |
| | | | | 382/145 |
| 2014/0270431 A1* | 9/2014 | Xu | ..................... | G06F 18/2414 |
| | | | | 382/128 |
| 2015/0226680 A1* | 8/2015 | Turovets | ................ | G01B 11/24 |
| | | | | 356/237.5 |
| 2015/0323316 A1* | 11/2015 | Shchegrov | ............ | G01B 11/27 |
| | | | | 702/150 |
| 2019/0378012 A1* | 12/2019 | Tripodi | .................. | G01B 11/02 |

* cited by examiner

SELF-SUPERVISED REPRESENTATION LEARNING FOR INTERPRETATION OF OCD DATA

FIELD OF THE INVENTION

The present invention relates generally to the field of optical inspection of integrated circuit wafer patterns, and in particular to algorithms for measurement of wafer pattern parameters.

BACKGROUND

Integrated circuits (ICs) are produced on semiconductor wafers through multiple steps of depositing, altering, and removing thin layers that build up into stacked structures on the wafers. These stacked structures, or "stacks," are typically formed in repetitive patterns that, like diffraction gratings, have optical properties. Modern metrology methods for measuring critical dimensions (CDs) and material properties of these patterns exploit these optical properties. Hereinbelow, CDs and material properties are also referred to as "pattern parameters," or simply as "parameters." These parameters may include the height, width, and pitch of stacks. As described by Dixit, et al., in "Sensitivity analysis and line edge roughness determination of 28-nm pitch silicon fins using Mueller matrix spectroscopic ellipsometry-based optical critical dimension metrology," J. Micro/Nanolith. MEMS MOEMS. 14(3), 031208 (2015), incorporated herein by reference, pattern parameters may also include: side wall angle (SWA), spacer widths, spacer pull-down, epitaxial proximity, footing/undercut, over-fill/under-fill of 2-dimentional (HKMG), 3-dimentional profile (Fin-FETs) and line edge roughness (LER).

Optical critical dimension (OCD) metrology employs methods of scatterometry to measure scatterometric data, that is, reflected light radiation that is indicative of optical properties of patterns. A measurement set of scatterometric data (which may also be referred to as a scatterometric signature) may include data points of reflected irradiance versus an incident angle of radiation (which may be zeroth-order measurements). Alternatively, or additionally, scatterometric data may include spectrograms that are measures of reflected radiation intensity over a range of wavelengths or frequencies. Additional types of scatterometric data known in the art may also be applied in OCD metrology.

U.S. Pat. No. 6,476,920 to Scheiner and Machavariani, "Method and apparatus for measurements of patterned structures," incorporated herein by reference, describes development of an "optical model" (also referred to as "physical model"). An optical model is a function (i.e., a set of algorithms) defining a relation between reflected radiation and the physical structure of a wafer. That is, optical models are theoretical models of how light is reflected from patterns with known parameters. Such optical models can therefore be applied to generate, from a set of known pattern parameters, an estimate of scatterometry data that would be measured during spectrographic testing. Optical models can also be designed to perform the converse (or "inverse") function, of estimating pattern parameters based on measured scatterometry data.

Optical models are commonly applied for OCD metrology during IC production to measure, based on scatterometric measurements, whether wafer patterns are being fabricated with correct parameters. Each pattern of a given wafer may be measured to determine how much the parameters of each patterns varies from a design specification or from a mean value.

As an alternative to optical modeling, machine learning (ML) techniques may be applied to estimate pattern parameters based on scatterometry data. For example, as described in PCT patent application WO 2019/239380 to Rothstein, et al., incorporated herein by reference, a machine learning model may be trained to identify correspondences between measured scatterometry data and reference parameters measured by methods described below. After an ML model is trained to estimate parameters from scatterometry data, it may then be applied to make such parameter estimates during IC production.

Exemplary scatterometric tools for measuring (acquiring) scatterometry data (e.g., spectrograms) may include spectral ellipsometers (SE), spectral reflectometers (SR), polarized spectral reflectometers, as well as other optical critical dimension (OCD) metrology tools. Such tools are incorporated into OCD metrology systems currently available. One such OCD metrology system is the NOVA T600® Advanced OCD Metrology tool, commercially available from Nova Measuring Instruments Ltd. of Rehovot, Israel, which takes measurements of pattern parameters that may be at designated test sites or "in-die." Additional methods for measuring critical dimensions (CDs) include interferometry, X-ray Raman spectrometry (XRS), X-ray diffraction (XRD), and pump-probe tools, among others. Some examples of such tools are disclosed in U.S. Pat. Nos. 10,161,885, 10,054,423, 9,184,102, and 10,119,925, and in international pending patent application publication WO2018/211505, all assigned to the Applicant and incorporated herein by reference in their entirety.

High accuracy methods of measuring pattern parameters that do not rely on the optical models described above include wafer measurements with equipment such as CD scanning electron microscopes (CD-SEMs), atomic force microscopes (AFMs), cross-section tunneling electron microscopes (TEMs), or X-ray metrology tools. These methods are typically more expensive and time-consuming than optical and ML modeling methods.

However, optical and ML modeling also have shortcomings. Because geometric models used for optical modeling are idealizations of actual pattern parameters, and because of the difficulties in solving non-linear scattering equations numerically, optical modeling is also time consuming and is also prone to errors, especially as the dimensions of pattern parameters continue to shrink. On the other hand, due to its physics-based foundations, optical modeling is generally reliable. Moreover, the direct association between physical parameters and theoretical optical properties means that optical model results are typically more easily interpretable than ML results. ML modeling, on the other hand, while avoiding some of the time-consuming hurdles of optical modeling, typically requires large data sets of reference parameters and scatterometry data for training, and the acquisition of these parameters also requires expensive, time consuming metrology equipment. Embodiments of the present invention as disclosed hereinbelow help to overcome the shortcomings of both these methods.

SUMMARY

Embodiments of the present invention provide a system and methods for generating machine learning models for OCD by self-supervised representation learning. Embodiments include a method for OCD metrology that includes:

receiving multiple first sets of scatterometric data; dividing each of the multiple first sets of scatterometric data into k sub-vectors; and training, in a self-supervised manner, $k^2$ auto-encoder neural networks, mapping each of the k sub-vectors to each other, where the $k^2$ auto-encoder neural networks include $k^2$ respective encoder neural networks each having at least one internal bottleneck layer. The method may further include receiving multiple respective sets of reference parameters and multiple corresponding second sets of scatterometric data, measured from multiple respective wafer patterns; and training a transfer neural network (NN) having initial layers including a parallel arrangement of the $k^2$ encoder neural networks, wherein the transfer NN training comprises training one or more final layers that follow the bottleneck layers of the encoder neural networks, and wherein target output of the transfer NN training is set to the multiple sets of reference parameters and feature input is set to the multiple corresponding second sets of scatterometric data, such that the transfer NN is trained to estimate new wafer pattern parameters from subsequently measured sets of scatterometric data.

In some embodiments, setting the multiple second sets of scatterometric data as the feature input for the transfer NN training may include providing, at an input layer of the transfer NN, for each of the second sets of scatterometric data, k sets of each of the k sub-vectors of each of the second sets of scatterometric data.

In some embodiments, multiple second sets of scatterometric data may include a subset of the multiple first sets of scatterometric data. Training the transfer neural network may include minimizing a loss function with respect to the multiple sets of reference parameters. The loss function may be a mean squared error (MSE) function. The multiple sets of reference parameters may be measured with high accuracy metrology by one or more of a CD scanning electron microscope (CD-SEM), an atomic force microscope (AFM), a cross-section tunneling electron microscope (TEM), or an X-ray metrology tool. The multiple respective wafer patterns may be located on one or more wafers. The multiple sets of scatterometric data may also be measured by two or more measurement channels.

Further embodiments of the present invention provide a system for OCD metrology including a processor having non-transient memory, the memory including instructions that when executed by the processor cause the processor to implement steps of: receiving multiple first sets of scatterometric data; dividing each of the multiple first sets of scatterometric data into k sub-vectors; and training, in a self-supervised manner, $k^2$ auto-encoder neural networks, mapping each of the k sub-vectors to each other, where the $k^2$ auto-encoder neural networks include $k^2$ respective encoder neural networks each having at least one internal bottleneck layer. Steps implemented by the system may further include receiving multiple respective sets of reference parameters and multiple corresponding second sets of scatterometric data, measured from multiple respective wafer patterns; and training a transfer neural network (NN) having initial layers including a parallel arrangement of the $k^2$ encoder neural networks, wherein the transfer NN training comprises training one or more final layers that follow the bottleneck layers of the encoder neural networks, and wherein target output of the transfer NN training is set to the multiple sets of reference parameters and feature input is set to the multiple corresponding second sets of scatterometric data, such that the transfer NN is trained to estimate new wafer pattern parameters from subsequently measured sets of scatterometric data.

BRIEF DESCRIPTION OF DRAWINGS

For a better understanding of various embodiments of the invention and to show how the same may be carried into effect, reference is made, by way of example, to the accompanying drawings. Structural details of the invention are shown to provide a fundamental understanding of the invention, the description, taken with the drawings, making apparent to those skilled in the art how the several forms of the invention may be embodied in practice. In the figures.

DETAILED DESCRIPTION

Embodiments of the present invention provide systems and methods for generating machine learning (ML) models for optical critical dimension (OCD) monitoring, by training an ML model with scatterometry data, where the ML training includes a self-supervised training stage.

Figure 1:
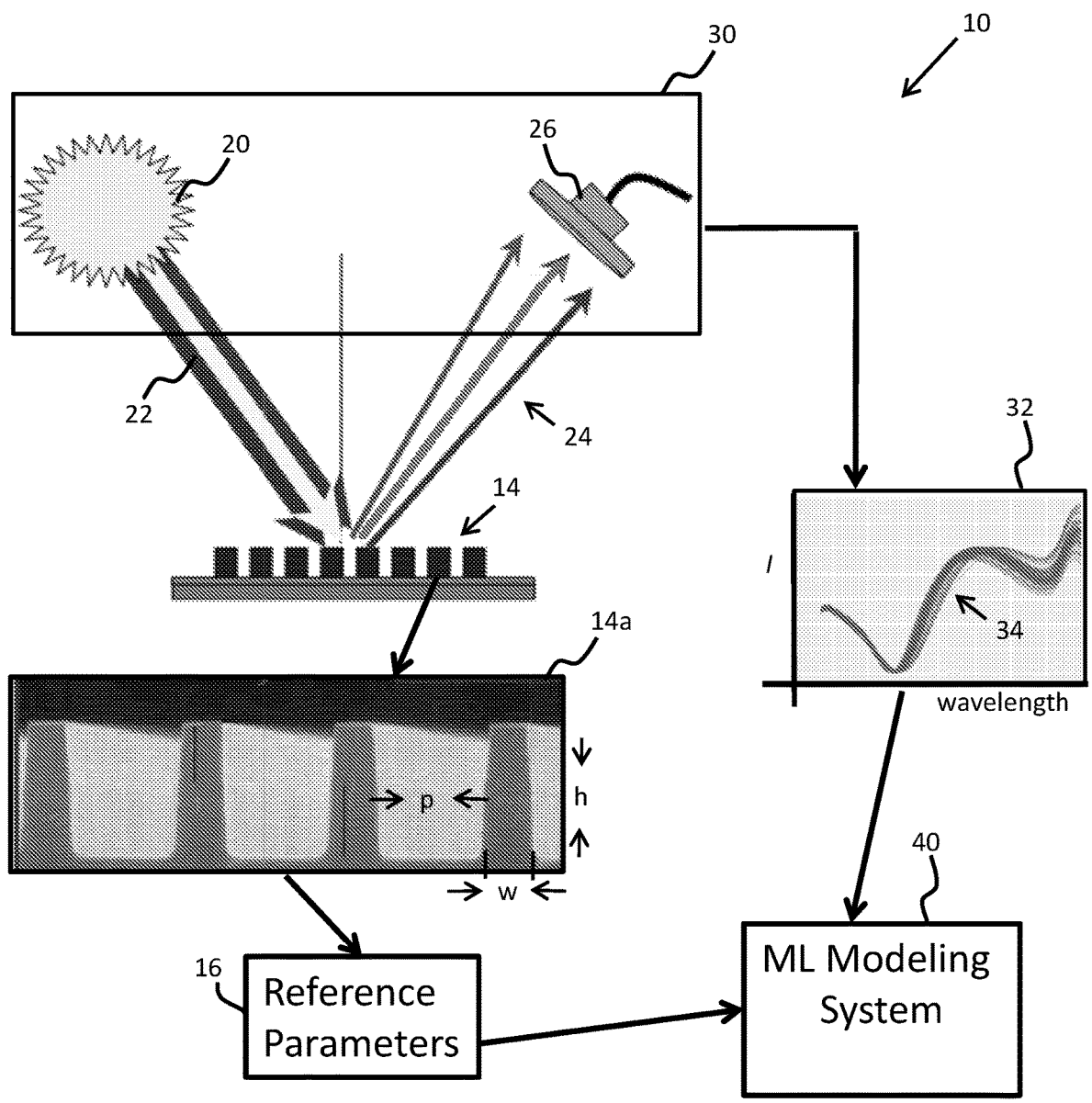
FIG. 1 is a schematic diagram of a system for generating a machine learning model for OCD metrology, by self-supervised representation learning, in accordance with an embodiment of the present invention.

FIG. 1 is a schematic diagram of a system for generating a machine learning model for OCD metrology, by self-supervised representation learning, in accordance with an embodiment of the present invention.

The system 10 may operate within a production line (not shown) for production and monitoring of wafers 12. As indicated, wafers 12 include patterns 14. These patterns have parameters, such as height ("h"), width ("w"), and pitch ("p"), as indicated in the pattern enlargement 14a, as well as other parameters described in the Background above. Typically, wafers have multiple regions, or segments, or "dies" that are designed to have the same patterns (i.e., the same pattern design is used to manufacture all of the patterns). For each pattern, a set of multiple parameters may be measured. Hereinbelow, this set of multiple parameters is also referred to as a vector $\vec{p}$, each element of the vector being one of the multiple parameter CDs.

Manufacturing variations cause slight variations in the parameters of patterns between wafers and across a single wafer, variations that are indicated by variations in measured scatterometry data.

The system 10 includes a light source 20, which generates a beam of light 22 of a predetermined wavelength range. The beam of light 22 is reflected from the wafer patterns 14 (indicated as reflected, or "scattered," light 24) towards a spectrophotometric detector 26. In some configurations, the light source and spectrophotometric detector are included in an OCD metrology system 30 (e.g., ellipsometer or a spectrophotometer). The construction and operation of the metrology system 30 may be of any known kind, for example, such as disclosed in U.S. Pat. Nos. 5,517,312, 6,657,736, and 7,169,015, and in international pending patent application publication WO2018/211505, all assigned to the Applicant and incorporated herein by reference in their entirety. Typically the metrology system 30 includes additional components, not shown, such as light directing optics, which may include a beam deflector having an objective lens, a beam splitter and a mirror. Additional components of such systems may include imaging lenses, polarizing lenses, variable aperture stops, and motors. Operation of such elements is typically automated by computer controllers, which may include I/O devices and which may also be configured to perform data processing tasks, such as generating scatterometry data 32.

The scatterometry data 32 generated by the metrology system 30 typically includes various types of plotted data 34, which may be represented in vector form (e.g., a spectrogram, whose data points are measures of reflected light intensity "I" at different light wavelengths, or a mapping of reflected irradiance vs. incident angle). As described above, variations between sets of scatterometric data are indicative of differing pattern parameters. In typical OCD metrology, the range of light that is measured may cover the visible light spectrum and may also include wavelengths in ultraviolet and infrared regions. A typical spectrogram output for OCD metrology may have 245 data points covering a wavelength range of 200 to 970 nm.

In embodiments of the present invention, a computer system including ML tools known in the art, referred to herein as an ML modeling system 40, may be configured for training an ML model for OCD metrology. Input training feature sets (also referred to as feature input) that are used by the ML modeling system may include sets of scatterometric data 34. Reference parameters 44 may be used as target output for ML training. The reference parameters may be acquired from patterns of one or more wafers by high accuracy means known in the art, such as described above (e.g., CD-SEM, AFM, TEM, X-ray metrology, or high accuracy OCD spectroscopy relying on optical modeling). After training, the ML model is used to predict pattern parameters based on sets of scatterometric data, which may be applied, for example, in the monitoring of wafer production.

The ML modeling system 40 may operate independently of the metrology system 30 or may be integrated with the metrology system.

Hereinbelow, the following symbolic nomenclature is used. A set of scatterometric data generated by a spectrophotometer may be referred to as a scatterometric vector $\vec{S}$, where each element of the vector represents a data point of the scatterometric data. A set of reference parameters, i.e., a set of parameters measured from a wafer pattern (e.g., side wall angle, spacer width, etc.) may be referred to as a parameter vector $\vec{p}$, where each element of the vector represents one of the one or more reference parameters of the set.

Figure 2:
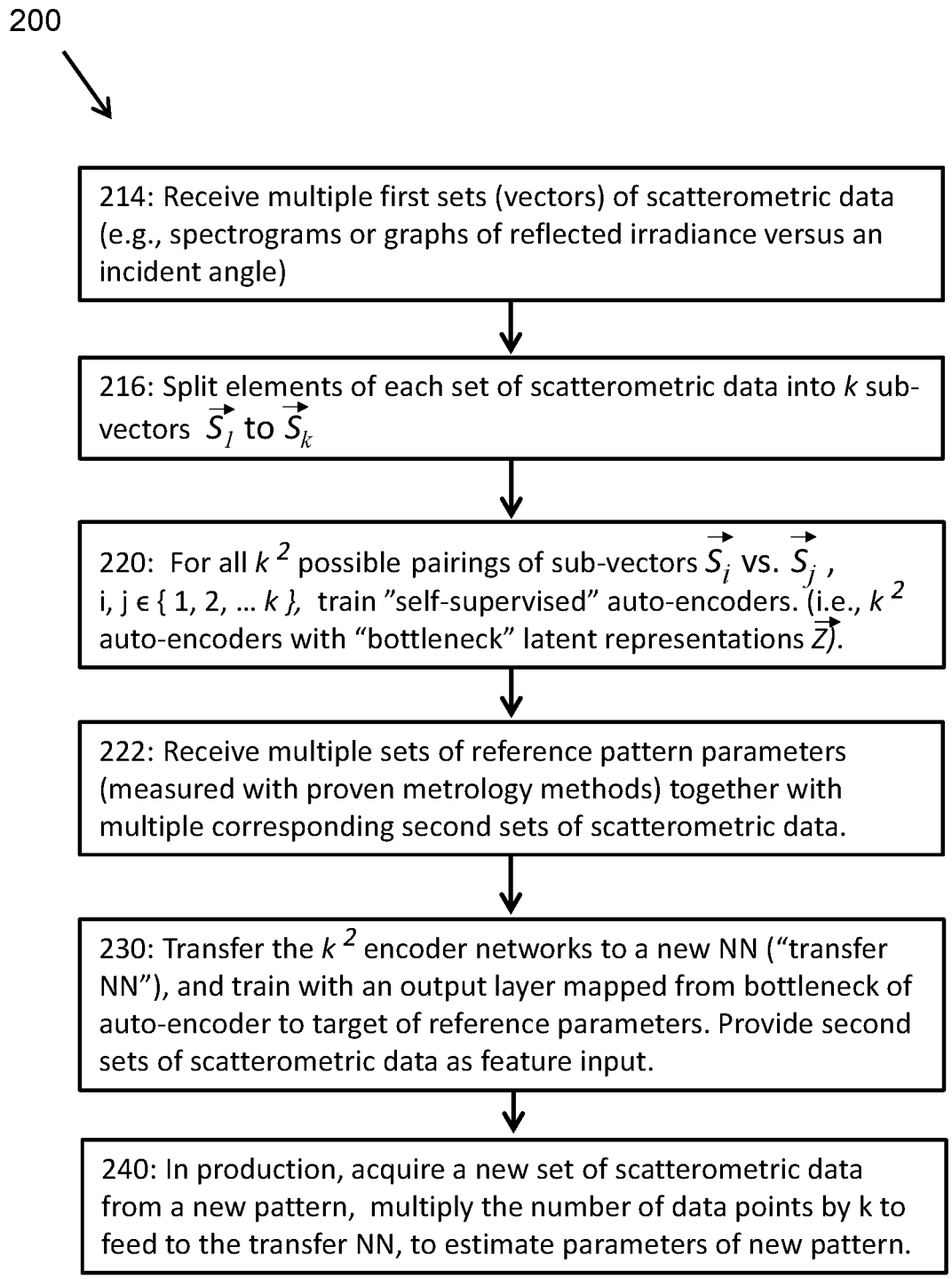
FIG. 2 is a flow diagram depicting a process for generating a machine learning model for OCD metrology, by self-supervised representation learning, in accordance with an embodiment of the present invention.

FIG. 2 is a flow diagram depicting a computer-implemented process 200 for generating a machine learning model for OCD metrology, by self-supervised representation learning, in accordance with an embodiment of the present invention. Process 200 may be implemented by the ML modeling system 40, described above.

A first step 214 includes receiving multiple sets of scatterometric data, measured from respective wafer patterns.

Next, at a step 216, each set of scatterometric data $\vec{S}$ is split into k sub-vectors, that is, $\vec{S}=\{\vec{S}_1^{sub}, \vec{S}_2^{sub}, \ldots \vec{S}_k^{sub}\}$.

Hereinbelow, the sub-vectors of a set of scatterometric data are distinguished by subscripts, e.g., $\vec{S}_i^{sub}$ and $\vec{S}_j^{sub}$ are two exemplary sub-vectors of a set of k sub-vectors, i, j∈{1, 2, . . . k}. The total number of data points of a set of scatterometric data $\vec{S}$ is therefore equal to the sum of data points of the k sub-vectors.

Next, at a step 220, for each $\vec{S}$, all the k sub-vectors of $\vec{S}$ are paired with each of the k sub-vectors of the same $\vec{S}$, to generate $k^2$ sub-vector pairs. Each of the sub-vector pairs is then applied to perform "self-supervised" training of an auto-encoder neural network (NN), one sub-vector of the pair being the feature input, and the other sub-vector of the pair being the target output. In all, $k^2$ auto-encoder NNs are trained.

For example, if each $\vec{S}$ has 256 data points and is divided into 4 sub-vectors (i.e., k=4), then each sub-vector has 64 data points. Sixteen auto-encoder NNs are then trained by "self-supervised" training, mapping each sub-vector to each sub-vector. Each encoder network for such an example would have an input layer of 64 nodes. These input layers may be followed by hidden layers including an internal "code" or "latent representation" layer, followed by a mirror image decoder network, i.e., a decoder with hidden layers leading to an output layer of 64 nodes. Optimization of auto-encoder layers and nodes may be performed according to methods known in the art.

Figure 3A:
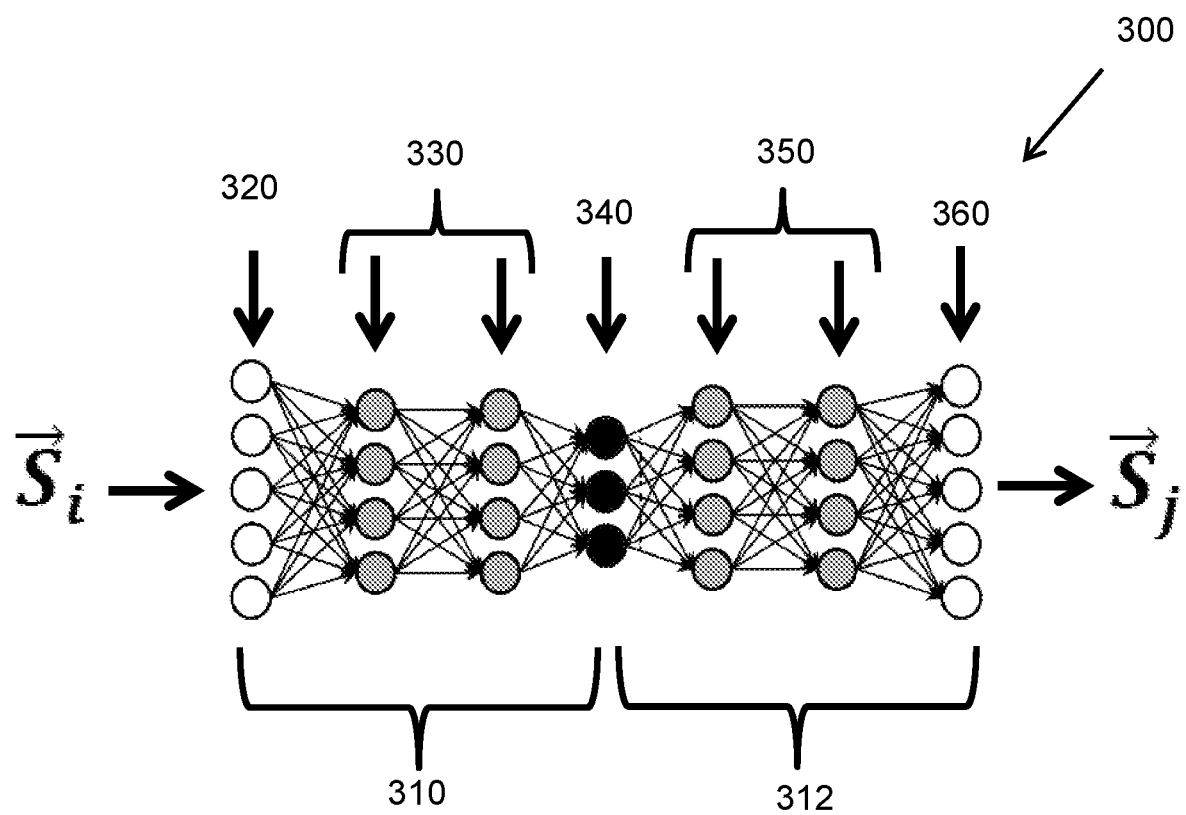
FIGS. 3A and 3B are schematic diagrams of two stages of neural network training to implement the machine learning model, for OCD metrology, in accordance with an embodiment of the present invention.

FIG. 3A shows a schematic representation of an exemplary auto-encoder neural network 300, one of the $k^2$ auto-encoder NNs that are trained. As indicated, it is trained with an input sub-vector $\vec{S}_i^{sub}$ and an output sub-vector $\vec{S}_j^{sub}$. The auto-encoder NN may be designed to be fully connected. An encoder network 310 of the auto-encoder NN includes an input layer 320 and hidden layers 330, leading to an internal "code" or "latent representation" layer 340. A decoder network 312 is a mirror image of the encoder network, with hidden layers 350 leading to an output layer 360. In the example of the auto-encoder NN 300 shown, both the encoder and decoder networks have two hidden layers. For simplicity, not all nodes are shown. As described above, the input and output layers may have 64 nodes, while the hidden layers other than the internal code layer may have 32 nodes, and the internal code layer (also referred to as a "bottleneck" layer) may have 16 nodes.

Referring back to FIG. 2, after the $k^2$ auto-encoder networks 300 are trained, and after new data sets are received at a step 222. a transfer learning stage of NN training is performed at a step 230.

The new data sets received at step 222 include multiple sets of reference parameters, measured with proven metrology methods from respective wafer patterns, and multiple corresponding sets of scatterometric data (measured from the same respective wafer patterns as their corresponding sets of reference parameters). The reference patterns from which measurement are made are typically a portion of a full wafer (such as a "die"), the portion typically being repeated over the surface of the wafer. The reference parameters may be measured with high accuracy metrology methods that may include CD-SEM, AFM, TEM, X-ray metrology, or high accuracy OCD spectroscopy relying on optical modeling. (The number of sets of reference parameters measured defines the size of the training data set as described below.)

The sets of scatterometric data corresponding to reference parameters that are acquired at step 230 may be unrelated to the scatterometric data acquired at step 214 for the first stage of NN training, or the two groups may be related. For example, the sets of scatterometric data corresponding to reference parameters acquired at step 230 may be a subset of the scatterometric data acquired at step 214 for the first stage of NN training. (It is to be understood that "wafer patterns" from which reference parameters and scatterometric data are measured are typically fabricated dies, which may be measured from one or more wafers).

The $k^2$ encoder networks 310 of the respective $k^2$ auto-encoders NN 300 are combined in parallel into an input stage of a new neural network, referred herein as a "transfer NN."

The feature input for training the transfer NN has the same form as the feature input used to train the encoder networks, i.e., the feature input includes $k^2$ sub-vectors of each set of scatterometric data. It should be noted that the input feature set is therefore, in effect, a set of scatterometric data (made of k sub-vectors), which is duplicated k times, i.e., $k \times \vec{S} = (\vec{S}_1, \vec{S}_2, \vec{S}_3, \vec{S}_4) = (\vec{S}_{1,1}^{sub}, \vec{S}_{1,2}^{sub}, \ldots \vec{S}_{1,k}^{sub}, \vec{S}_{2,1}^{sub}, \vec{S}_{2,2}^{sub}, \ldots \vec{S}_{k,k}^{sub})$. For the example described above, with sets of scatterometric data having 256 data points, the transfer NN would have a total of 4×256=1024 input nodes.

The target output of the transfer NN is set to the vectors of reference parameters that correspond to the sets of scatterometric data. That is, each set of feature input, consisting of the $k^2$ sub-vectors of each set of scatterometric data, is mapped to the corresponding reference parameters measured from the same wafer pattern. The number of output nodes equals the number of elements in the sets of reference parameter (i.e., the number of elements of each reference parameter vector $\vec{p}$). This is typically equal to between 1 and 10 parameters. Typically, the loss function that the auto-encoder is trained to minimize is a mean squared error (MSE) loss function.

Figure 3B:
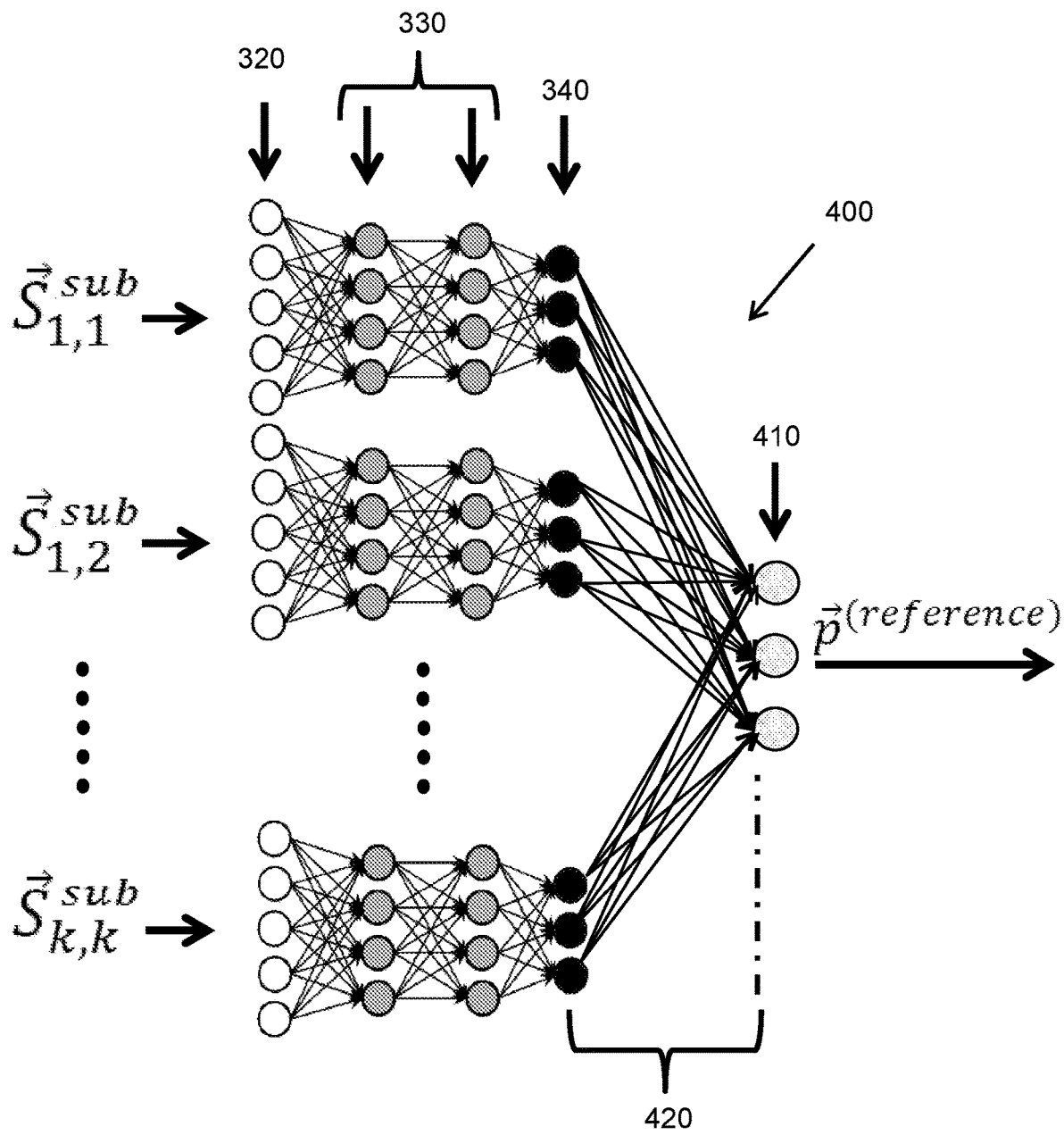

FIG. 3B shows a schematic representation of an exemplary transfer NN 400. The feature input for training the transfer NN is shown as the $k^2$ sub-vectors $\vec{S}_{i,j}^{sub}$ (only three of the sub-vectors are actually presented, with dots indicating the remainder of the sub-vector inputs). The target output for training the transfer NN is shown as the corresponding sets of reference parameters (indicated as $\vec{p}^{(reference)}$).

The initial layers of the transfer NN 400 are the merged encoder networks 310 of the auto-encoder NNs 300, i.e., with merged input layers 320, followed by hidden layers 330 (other than the code layer), leading to the internal "code" layer (or "bottleneck layer") 340. The number of nodes of the output layer 410 is equal to the number of data points in the reference parameter vectors. This may be, for example, three parameters, as shown in the figure, e.g., height, width, and pitch of a given wafer stack. In effect, training the transfer NN creates a mapping from the bottleneck layer 340 to the output layer 410. (It is to be understood that the auto-encoder networks include at least one hidden layer, which is the bottleneck layer.) Training is typically performed according to standard ML training methods, which may include, for example, L2 regularization. Typically, the loss function that the transfer NN is trained to minimize is a mean squared error (MSE) loss function. Preferably, a validation set of data would use sets of scatterometric data acquired from different wafers than those used in the training data set.

After the transfer NN is trained and validated, it can be used in production, as indicated by a step 240 of FIG. 2. In production, new sets of scatterometric data are measured from a given wafer pattern, the data points of the new set of scatterometric data are copied k times to feed to the transfer NN (also referred to herein as the ML model), which then provides an estimate of parameters of the given wafer pattern.

The ML model was described above as being trained on one set of scatterometric data at a time, but multiple sets of scatterometric data may be used simultaneously, which may further improve model accuracy. For example, feature input could be used that combines two measurement sets of scatterometric data, each of 245 data points, giving an input vector $\vec{S}$ of 490 data points. The two sets of scatterometric data could be taken from different "channels," i.e., from different measurement configurations for the same wafer pattern. For example, the incident light angle or light polarization could be changed to create two different sets of scatterometric data both providing information with respect to the measured pattern. For a k of 4, the input layer of the transfer NN would have 4×490=1960 nodes.

Figure 4:
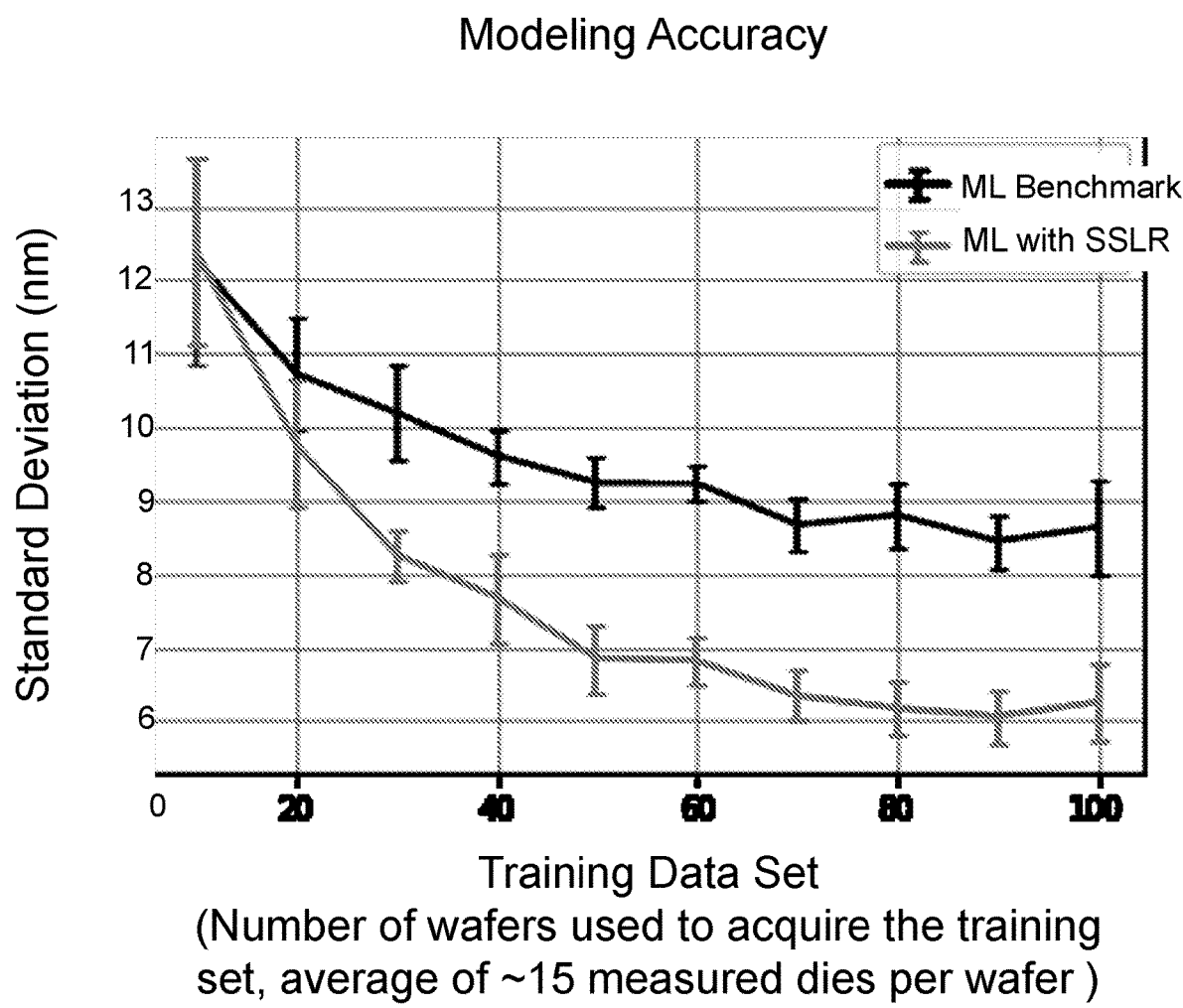
FIG. 4 is a graph indicating accuracy of machine learning (ML) models trained by self-supervised representation learning as opposed to ML models trained only with a single neural network training stage, in accordance with an embodiment of the present invention.

FIG. 4 is a graph indicates accuracy of a machine learning (ML) models as a function of training data set size, for two exemplary ML models. One model is a "transfer ML" model, trained in two stages, with a first stage using self-supervised representation learning (i.e., "ML with SSLR"), according to embodiments of the present invention. The other model is a "ML benchmark" model trained only with a single neural network training stage (correlating measured scatterometry data with reference parameters), such as described in the abovementioned PCT patent application WO 2019/239380 to Rothstein, et al. As indicated in the graph, the standard deviations between reference parameters and parameters predicted by the transfer NN model are lower (i.e., the accuracy is better) than for the ML benchmark model. The standard deviation of an ML model's predicted output $\vec{p}^{(predicted)}$ is typically calculated as follows:

$$std\left(\vec{p} - \vec{p}^{(predicted)}\right) = \sqrt{\frac{\sum_i \left(\left(\vec{p}_i^{(reference)} - \vec{p}_i^{(predicted)}\right) - \left(\vec{p}_i^{(reference)} - \vec{p}_i^{(predicted)}\right)\right)^2}{n}}$$

Training data sets of varying sizes, indicated at points marked by error bars in the graph, were selected randomly several times out of a large pool. The error-bars indicate 1-sigma uncertainties due to this re-sampling. As indicated, the methods of the present invention show significantly better accuracy than the ML benchmark, for training data sets of data from 5 wafers or more (i.e., approximately 75 patterns or more, as each wafer is a source of an average of approximately 15 measured patterns). Dimensionality reduction methods such as kernel principal component analysis (kernel PCA) did not improve the fit compared to the full set of measured data.

As is shown in the graph, process 200 results in more accurate ML models than the ML benchmark method.

It is to be understood that processing elements shown or described herein are preferably implemented by one or more computers in computer hardware and/or in computer software embodied in a non-transitory, computer-readable medium in accordance with conventional techniques, such as employing a computer processor, a memory, I/O devices, and a network interface, coupled via a computer bus or alternate connection arrangement.

Unless otherwise described, the terms "processor" and "device" are intended to include any processing device, such as, for example, one that includes a CPU (central processing unit) and/or other processing circuitry (e.g., GPUs), and may refer to more than one processing device. Various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette, tapes), flash memory, etc. Such memory may be considered a computer readable storage medium.

In addition, phrases "input/output devices" or "I/O devices" may include one or more input devices (e.g., keyboard, mouse, scanner, HUD, etc.) for entering data to the processing unit, and/or one or more output devices (e.g., speaker, display, printer, HUD, AR, VR, etc.) for presenting results associated with the processing unit.

Embodiments of the invention may include a system, a method, and/or a computer program product. The computer program product may include a computer readable storage medium (or media) having computer readable program instructions thereon for causing a processor to carry out aspects of the invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), Blue-Ray, magnetic tape, Holographic Memory, a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the invention.

Where aspects of the invention are described herein with reference to flowchart illustrations and/or block diagrams of methods, apparatus (systems), and computer program products according to embodiments of the invention, it will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Any flowchart and block diagrams included herein illustrate the architecture, functionality, and operation of possible implementations of systems, methods, and computer program products according to various embodiments of the invention. In this regard, each block in the flowchart or block diagrams may represent a module, segment, or portion of instructions, which comprises one or more executable instructions for implementing the specified logical function (s). In some alternative implementations, the functions noted in the block may occur out of the order shown herein. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for OCD metrology, comprising:
receiving multiple first sets of scatterometric data;
dividing each of the multiple first sets of scatterometric data into k sub-vectors;
training, in a self-supervised manner, $k^2$ auto-encoder neural networks, mapping each of the k sub-vectors to each other, wherein the $k^2$ auto-encoder neural networks include $k^2$ respective encoder neural networks each having at least one internal bottleneck layer;
receiving multiple respective sets of reference parameters and multiple corresponding second sets of scatterometric data, measured from multiple respective wafer patterns; and
training a transfer neural network (NN) having initial layers including a parallel arrangement of the $k^2$ encoder neural networks, wherein the transfer NN training comprises training one or more final layers that follow the bottleneck layers of the encoder neural networks, and wherein target output of the transfer NN training is set to the multiple sets of reference parameters and feature input is set to the multiple corresponding second sets of scatterometric data, such that the transfer NN is trained to estimate new wafer pattern parameters from subsequently measured sets of scatterometric data.

2. The method of claim 1, wherein setting the multiple second sets of scatterometric data as the feature input for the transfer NN training comprises providing, at an input layer of the transfer NN, for each second set of scatterometric data, k sets of each of k sub-vectors of the second set of scatterometric data.

3. The method of claim 1, wherein the multiple second sets of scatterometric data include a subset of the multiple first sets of scatterometric data.

4. The method of claim 1, wherein training the transfer neural network comprises minimizing a loss function with respect to the multiple sets of reference parameters, and wherein the loss function is a mean squared error (MSE) function.

5. The method of claim 1, wherein the multiple sets of reference parameters are measured with high accuracy metrology by one or more of a CD scanning electron microscope (CD-SEM), an atomic force microscope (AFM), a cross-section tunneling electron microscope (TEM), or an X-ray metrology tool.

6. The method of claim 1, wherein the multiple respective wafer patterns are located on one or more wafers.

7. The method of claim 1, wherein the multiple sets of scatterometric data are measured by two or more measurement channels.

8. A system for OCD metrology compromising a processor having non-transient memory, the memory including instructions that when executed by the processor cause the processor to implement steps of:
receiving multiple first sets of scatterometric data;
dividing each of the multiple first sets of scatterometric data into k sub-vectors;
training, in a self-supervised manner, $k^2$ auto-encoder neural networks, mapping each of the k sub-vectors to each other, wherein the $k^2$ auto-encoder neural networks include $k^2$ respective encoder neural networks each having at least one internal bottleneck layer;
receiving multiple respective sets of reference parameters and multiple corresponding second sets of scatterometric data, measured from multiple respective wafer patterns; and
training a transfer neural network (NN) having initial layers including a parallel arrangement of the $k^2$ encoder neural networks, wherein the transfer NN training comprises training one or more final layers that follow the bottleneck layers of the encoder neural networks, and wherein target output of the transfer NN training is set to the multiple sets of reference parameters and feature input is set to the multiple corresponding second sets of scatterometric data, such that the transfer NN is trained to estimate new wafer pattern parameters from subsequently measured sets of scatterometric data.

9. The system of claim 8, wherein setting the multiple second sets of scatterometric data as the feature input for the transfer NN training comprises providing at an input layer of the transfer NN, for each second set of scatterometric data, k sets of each of k sub-vectors of the second set of scatterometric data.

10. The system of claim 8, wherein the multiple second sets of scatterometric data include a subset of the multiple first sets of scatterometric data.

11. The system of claim 8, wherein training the transfer neural network comprises minimizing a loss function with respect to the multiple sets of reference parameters, and wherein the loss function is a mean squared error (MSE) function.

12. The system of claim 8, wherein the multiple sets of reference parameters are measured with high accuracy metrology by one or more of a CD scanning electron microscope (CD-SEM), an atomic force microscope (AFM), a cross-section tunneling electron microscope (TEM), or an X-ray metrology tool.

13. The system of claim 8, wherein the multiple respective wafer patterns are located on one or more wafers.

14. The system of claim 8, wherein the multiple sets of scatterometric data are measured by two or more measurement channels.

* * * * *

UNITED STATES PATENT AND TRADEMARK OFFICE
CERTIFICATE OF CORRECTION

PATENT NO. : 11,747,740 B2
APPLICATION NO. : 17/790765
DATED : September 5, 2023
INVENTOR(S) : Ran Yacoby and Boaz Sturlesi It is certified that error appears in the above-identified patent and that said Letters Patent is hereby corrected as shown below:

In the Claims

Claim 8, Column 12, Line 12, the text "compromising" should read -- comprising --.

Signed and Sealed this
Third Day of September, 2024

Katherine Kelly Vidal
Director of the United States Patent and Trademark Office